United States Patent [19]

Southgate et al.

[11] Patent Number: 5,477,474

[45] Date of Patent: Dec. 19, 1995

[54] COMPUTER LOGIC SIMULATION WITH DYNAMIC MODELING

[75] Inventors: Timothy J. Southgate, San Carlos; James G. Schleicher, II, Sunnyvale, both of Calif.

[73] Assignee: Altera Corporation, San Jose, Calif.

[21] Appl. No.: 969,943

[22] Filed: Oct. 29, 1992

[51] Int. Cl.$^6$ .................................................. G06F 15/60
[52] U.S. Cl. ........................ 364/578; 364/489; 395/920
[58] Field of Search ................................... 364/578, 489, 364/488, 490, 801; 395/919, 920, 921

[56] References Cited

U.S. PATENT DOCUMENTS

| | | | |
|---|---|---|---|
| 4,527,249 | 7/1985 | Van Brunt | 364/578 |
| 4,831,543 | 5/1989 | Mastellone | 364/489 |
| 4,922,445 | 5/1990 | Mizoue et al. | 364/578 |
| 4,937,770 | 6/1990 | Samuels et al. | 364/578 |
| 4,939,681 | 7/1990 | Yokomizo et al. | 364/578 |
| 5,084,824 | 1/1992 | Lam et al. | 364/490 |
| 5,105,373 | 4/1992 | Rumsey et al. | 364/578 |
| 5,163,016 | 11/1992 | Har'El et al. | 364/578 |
| 5,220,512 | 6/1993 | Watkins et al. | 364/489 |
| 5,258,932 | 11/1993 | Matsuzaki | 364/578 |
| 5,278,769 | 1/1994 | Bair et al. | 364/490 |
| 5,297,066 | 3/1994 | Mayes | 364/488 |
| 5,301,318 | 4/1994 | Mittal | 395/600 |
| 5,351,197 | 9/1994 | Upton et al. | 364/491 |

OTHER PUBLICATIONS

J. D. Calhoun et al, "A Framework and Method for Hierarchical Test Generation", IEEE 1989 International Test Conference, paper 21.3, pp. 480–489.

G. Lakhani et al, "Partition Based Heuristics for Gate Matrix Layout", IEEE 1989 International Symposium on Circuits and Systems, pp. 897–900, vol. 2.

Pedram et al, "Interconnection Length Estimation for Optimized Standard Cell Layouts", IEEE 1989 International Conference on Computer–Aided Design, pp. 390—393.

Singh et al, "From Logic to Symbolic Layout for Gate Matrix", IEEE Trans. on CAD of Int. Circuits and Systems 1992, vol. 11, Iss. 2. pp. 216–227.

Primary Examiner—Emanuel T. Voeltz
Assistant Examiner—Craig Steven Miller
Attorney, Agent, or Firm—Townsend and Townsend and Crew

[57] ABSTRACT

A method for improving the performance of a computer logic simulator in a computer system in which the operation of a logic design is simulated by converting a network list representative of the logic design into a simulator netlist and applying predetermined input vectors to the simulator netlist representative of the logic design in order to generate output vectors representative of the response of the simulator netlist. Portions of the network list are converted to dynamic device models in the form of executable code, which is assembled in a dynamic device model file. The remaining portions of the network list are converted to a simulator netlist, which is stored in a simulator netlist file. Both the dynamic device models and the simulator netlist are used to perform the simulation process. Since the dynamic device models are in the form of executable code, which can be directly read during the simulation process, the speed of operation of the simulation process is substantially increased, with a corresponding reduction in the total processing time required. In addition, the size of the simulator netlist is substantially reduced.

6 Claims, 4 Drawing Sheets

$f(A,B,C) = AB + C$ 5,477,474

COMPUTER LOGIC SIMULATION WITH DYNAMIC MODELING

A portion of the disclosure of this patent document contains material which is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

This invention relates to the field of computer logic simulation.

Techniques are known for simulating the operation of a proposed logic design. One such technique is incorporated into the computer simulation software sold under the trademark MAX-PLUS available from Altera Corporation of San Jose, Calif. With reference to FIG. 1, a typical computer logic simulation technique proceeds by initially providing a logic design in the form of a schematic or netlist stored in a file (10) and converting the netlist by means of a logic compiler (12) into a simulator logic netlist (14) that is used by a logic simulator (15). A set of simulation input vectors (16) is also provided to the logic simulator (15), which reads the simulator logic netlist (14) along with the simulated input vectors (16) and "simulates" the operation of the logic design by propagating logic levels through the logic primitives in order to generate a set of output vectors (18), which are the simulated outputs of the logic design. This process has been found to be exceedingly useful in the field of logic design, particularly for complex circuits. However, this process can be very time consuming (particularly for complex circuits), since the simulator must continually interpret a very large netlist as it propagates the logic levels of the design.

SUMMARY OF THE INVENTION

The invention comprises a technique for improving the performance of computer logic simulation by substantially reducing the time required to perform the simulation process and substantially reducing the size of the simulator logic netlist.

In its broadest aspect, the invention comprises a method for improving the performance of computer logic simulation in a computer system in which the operation of a logic design is simulated by converting a network list representative of the logic design to a simulator network list and applying predetermined input vectors to the simulator along with the simulator network list representative of the logic design in order to generate output vectors representative of the response of the simulator network list. The method includes the steps of converting portions of the network list to dynamic device models in the form of executable code, storing the executable code in a dynamic model file, converting the remaining portions of the network list to a simulator network list, storing the simulator network list in a simulator network list file, and using both the dynamic device models stored in the dynamic model file and the simulator network list stored in the simulator network list file to perform the simulation process. The network list includes a plurality of individual networks at least some of which are coupled to operationally non-replaceable keeper nodes, and the step of converting portions of the network list to dynamic device models includes the steps of identifying all keeper nodes and selectively replacing individual networks coupled to some of the keeper nodes with individual dynamic device models. The step of selectively replacing individual networks includes the steps of identifying those networks to be replaced by a dynamic device model, and forming a dynamic device model corresponding to each such network thus identified.

The step of identifying those networks to be replaced by a dynamic device model includes the steps of tracing through a given network between all sources to the network and the associated keeper nodes, determining the total number of logic elements encountered during the tracing step, and selecting the network for replacement with a dynamic device model if the total number of logic elements encountered exceeds a pre-selected value. The step of tracing also includes the steps of determining whether the given network embodies a cyclic function, and terminating the tracing when a cyclic function is determined. The step of tracing further includes the steps of determining the minimum delay path through the given network between all sources and the associated keeper node, and inserting compensating delay elements for all paths having a transit time exceeding the minimum delay.

The step of forming a dynamic device model corresponding to a given network selected for replacement includes the steps of recursively generating a decision diagram for all devices in the given network, converting each decision diagram into executable code, and storing the code in the dynamic model file.

By replacing selected networks in the network list representing the logic design with dynamic device models in the form of executable code, the speed with which the simulation can be performed is substantially increased, which reduces the total time required to complete the simulation process. In addition, the size of the simulator logic network list is significantly reduced, which provides a commensurate reduction in the volume of memory required to store the simulator logic network list.

For a fuller understanding of the nature and advantageous of the invention, reference should be had to the ensuing detailed description taken in conjunction with the accompanying drawings.

DESCRIPTION OF THE PREFERRED EMBODIMENT

Figure 1:
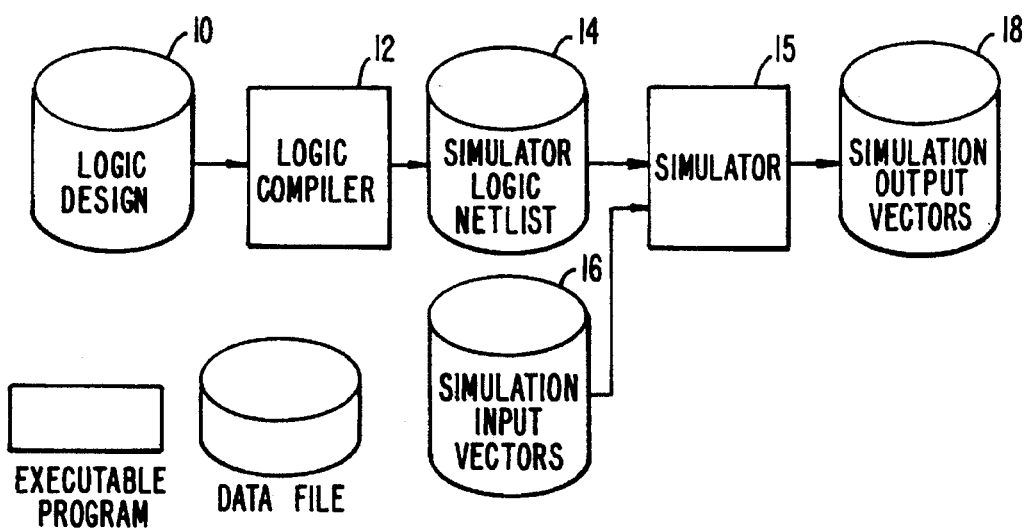
FIG. 1 is a schematic diagram showing a prior art computer logic simulator system.

Turning now to the drawings, as has already been described, FIG. 1 illustrates a prior art computer logic simulation system. In this Figure, elements depicted with rectangular geometry, such as the logic compiler (12) and simulator (15) represent executable programs, while elements depicted with cylindrical geometry, such as elements 10, 14, 16 and 18, represent data files.

Figure 2:
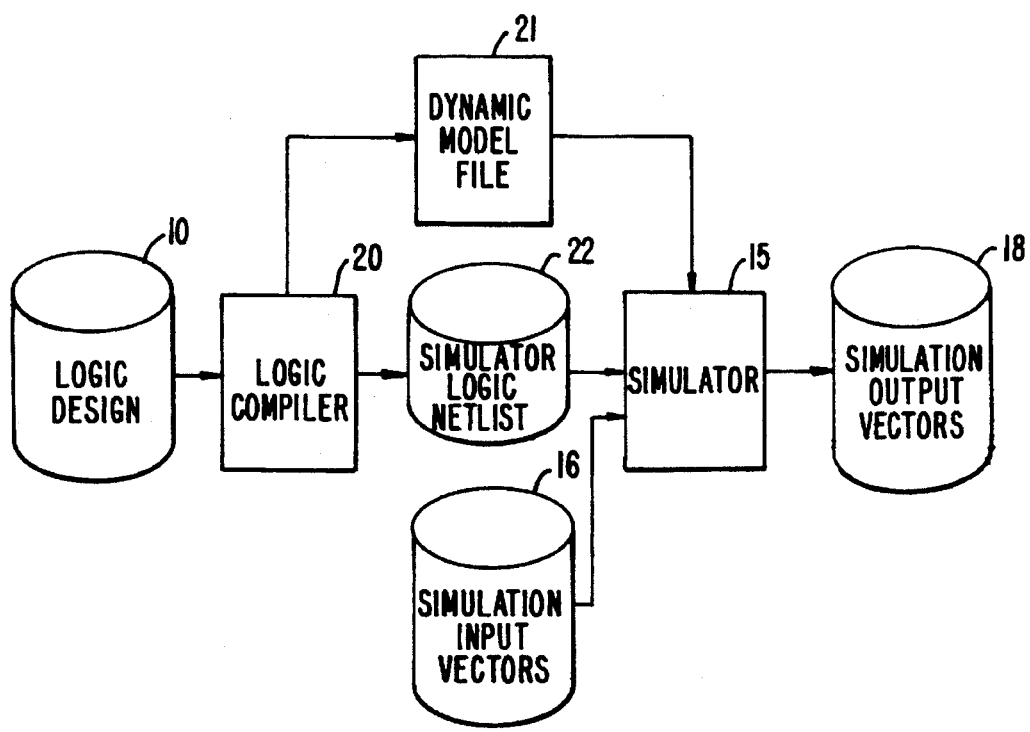
FIG. 2 is a schematic diagram illustrating a computer logic simulation system incorporating the invention.

With reference to FIG. 2, a system incorporating the invention employs elemental geometry identical to that used in FIG. 1, with identical reference numerals being applied to identical elements. Thus, the system shown in FIG. 2 includes a first file (10) containing the network list describing the logic design, a simulation input vector file (16), a simulator (15) and simulation output vector file (18). A logic compiler (20) examines the network list contained in the logic design file (10) and converts the network list of some portions into a section of executable code whose function is a "black box" that simulates that portion. The executable code forms a dynamic model file (21). Logic compiler (20) converts the netlist of the remaining portions of the network list stored in logic design file (10) into a simulator logic network list which is stored in a file (22). During simulation, input vectors are read by simulator (15), along with the contents of the simulator logic netlist file (22). When the simulator needs to simulate those portions of the original network list which were converted into executable code, the simulator simply executes the code in the dynamic model file (21) corresponding to that portion. Because execution of the code is a very fast operation compared to the interpretive operation which must be performed on the simulator logic network list, the speed of the simulation process is substantially increased, with the result that the process can be completed in a substantially shorter time period. In addition, the size of the simulator logic network list is significantly reduced due to the substitution of the executable code for selected portions of the original network list.

Figure 3:
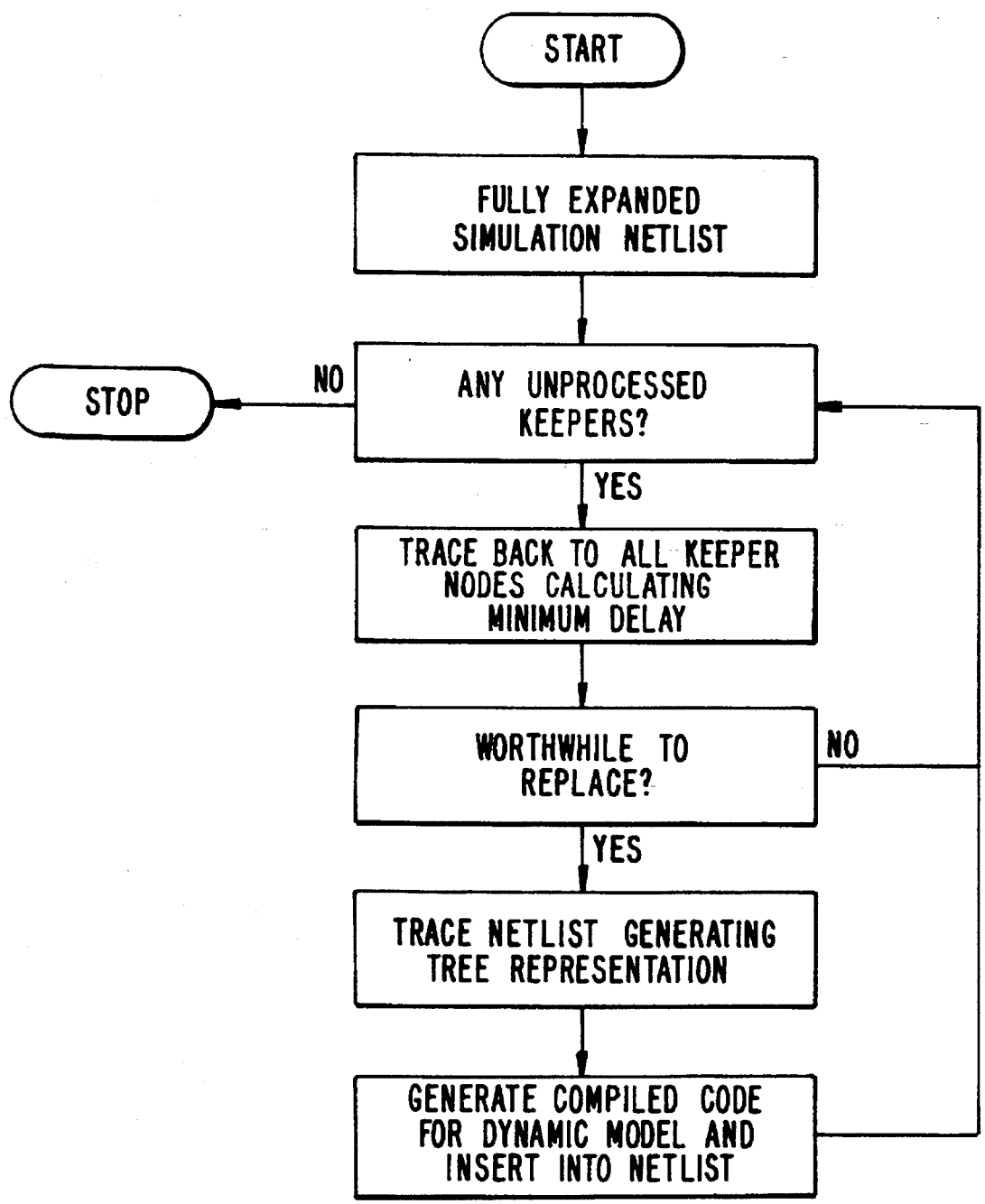
FIG. 3 is a flow chart illustrating the invention.

FIG. 3 illustrates the overall operation of the method of the invention. As seen in this Fig., the logic compiler first creates a fully expanded simulation network list from the original network list contained in the logic design file (10). Next, all "keeper" nodes are identified. A "keeper" node is a node whose removal is prohibited for one of three reasons: (a) the node does not feed any device; (b) the node feeds a device which cannot be traced through (as described more fully below); and (c) the node has a name whose removal is prohibited. Once all "keeper" nodes have been identified, each "keeper" node is processed by the logic compiler (20) to determine whether any network feeding a keeper node is eligible to be reduced to a dynamic device model (DDM) in the form of executable code. This eligibility test is conducted by tracing through the network associated to the keeper node back to all sources, eliminating any networks having devices which embody a cyclic function, and comparing the number of devices encountered in the network with a threshold value (3 in the preferred embodiment). If the network is deemed worthwhile for replacement, the network list is subjected to a further tracing process in the course of which a decision diagram is generated in the manner described below. After completion of the decision diagram, a compiled code is generated for the dynamic device model and inserted into the simulator logic netlist file (22). If the network is deemed not worthy of replacement, it is stored in the ordinary way in the simulator logic netlist file (22). After all "keeper" nodes have been thus processed, the system is now prepared to conduct the computer logic simulation process with the simulation input vectors.

According to the invention, all dynamic device models have three characteristics which contribute significantly to the efficiency of implementation. Firstly, all DDMs have only a single output. Secondly, all paths between the inputs and the output of a DDM have the same delay. Lastly, at no point within a DDM does a signal fan out, i.e., serve as an input to more than one device. In general, each DDM should comprise the largest possible network possessing all three characteristics.

The goal of the invention is to improve the speed of simulation by creating a single device that represents a network made up of numerous primitive devices. This results in improved simulation times because fewer events are scheduled to simulate changes. In an ordinary netlist an event may have to propagate through 9 or 10 devices before reaching a node of significance to the user. A dynamic model improves this by combining all the devices that feed a significant node into a single device. In this way a single event is scheduled to indicate the response of an entire network. DDMs are also faster because they are actual programs that are executed whenever an input change requires them to schedule an event. The SNF is smaller when DDMs are used because the number of nodes and devices stored in it is reduced.

To generate the DDM for the network feeding a node, the minimum delay from that node to the permanent nodes that feed it is first located. A permanent node is a node that cannot be removed because it has a name or is fed by a device that cannot be combined into a DDM. If it is worthwhile to reduce the network, a single graph is generated for the entire network. Any paths that are longer than the minimum delay calculated have a delay buffer for the time difference inserted between the source of the path and the DDM. The graph representing the network is converted into code for the DDM. Once all networks worthy of conversion have been converted, the SNF is pruned of all nodes and devices that are no longer connected to outputs.

The following is a description of the four main steps for generating DDMs: selection of a network, encryption of the network into a graph, compilation of the graph into an executable function and pruning the SNF once all the DDMs have been created.

DDM Generation Steps

Selection

Every named node in the SNF is found and the network that feeds it is checked. If replacement by a DDM will improve it, it is replaced. It is at this point that the smallest delay path is found to the destination node from all the permanent nodes that are sources for it. The sources are either named nodes (dedicated inputs, pad feedbacks or macrocell feedbacks) or nodes that are the outputs of devices that cannot be traced. AND, OR, XOR, NOT and DELAY devices can be traced through. DFF, DFFE and FILTER devices cannot be traced through. TRI-STATE and WIRE-AND devices will attempt to reduce the network that feeds them if the destination node is the output of the WIRE-AND and the network feeding them is combinatorial. Certain RISE-FALL devices cannot be traced with their normal behavior. To allow a network containing a RISE-FALL device to be reduced it is treated as a delay buffer with a delay equal to the larger of TRISE and TFALL.

Functional SNFs can also use DDMs to reduce their size, if these additions are made. Nodes named directly by netids (:<netid>) are not considered named nodes and NAND, NOR and XNOR are added to the traceable devices.

XOR devices are given special treatment when tracing the minimum delay path. If one input of the XOR feeds to GND or VCC the XOR is treated as a DELAY or NOT device respectively. This simplifies the network to be converted and removes the problem of short delay paths to constant node values. If one input of the XOR device uses quick register feedback to represent a TFF then the other input of the XOR becomes the destination node the network is traced to.

Encryption

A graph representing a network is generated once the minimum delay through the network is found, a starting point determined and the usefulness of replacement decided upon. The network is traced back to the source nodes from device to device by recursively combining the subnets of every device with the function of the given device. When a source node is reached, its delay path to the destination node is compared to the minimum delay path. If there is any difference a delay buffer of that value is inserted between the DDM and the source node. By storing a list of the nodes and their delays for each of the source nodes these nodes can be reused to minimize the number of inputs to the DDM (and the number of extra devices and nodes needed around the DDMs). Since every path is traced to a source node, even if part of it is reused (ie. a product term fans out within one equation), paths of different delay will be used as different inputs to the DDM. This does not result in more devices since all source nodes currently use a delay buffer to separate them from the product terms at all times. Also a product term can only fan out with different delay if it feeds expander paths of different lengths in the same equation, each of which results in two additional devices and two additional nodes per expander.

By moving all the additional delay out to the inputs of the DDM internal glitches are caused to disappear. This is not a problem because glitches on outputs will still occur and just the act of combing several devices into one causes some internal glitches to disappear.

Figure 4:
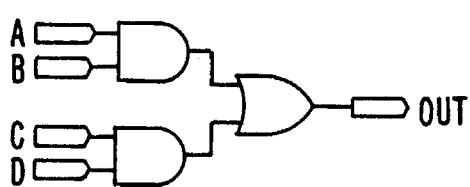
FIG. 4 is a logic diagram of a three gate network.
Figure 5:
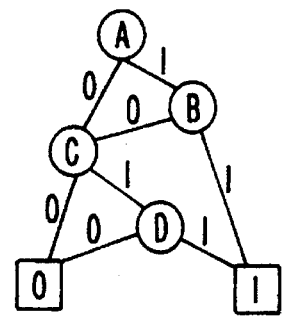
FIG. 5 is a binary decision diagram corresponding to the network of FIG. 4.

All the nets are represented by Binary Decision Diagrams (BDDs). A BDD is a rooted, directed acyclic graph that expresses a boolean function. It contains two types of vertices, nonterminal vertices that correspond to inputs to the BDD and terminal vertices that represent the values 0 and 1. Nonterminal vertices have two children corresponding to the value of the input associated with the vertex (0, 1). The children of a nonterminal vertex can either be another nonterminal vertex or a terminal vertex. All the inputs to the BDD are ordered in such a way that the nonterminal children of any vertex are lower in value than their parent. Terminal vertices have no children and are the lowest value of all vertices. To evaluate any BDD at most n decisions must be made where n is the number of inputs to the BDD. An example of a BDD corresponding to a simple three gate network is illustrated in FIGS. 4 and 5, respectively.

The optimal and easiest ordering of inputs in the preferred embodiment appears to be a first come first served ordering. By ordering the inputs as they are encountered in a depth-first search a BDD will be generated with the minimal width (memory) necessary to represent the equation. At every multi-input device the BDDs representing the subnets of the device will be combined by applying the function of the device to both BDDs and then reducing the resulting BDD into canonical form (Note that all inputs for a network must use the same ordering scheme for their BDDs to be combined, but a node that serves as an input to two networks for separate destination nodes can be ordered in different ways since the BDDs generated are completely separate from each other).

Compilation

Once a BDD is generated for a network it is converted into an executable function. These functions will be stored in a separate DLL of the name <project>.DLL. Each DDM in the original device is represented by a unique function in the DLL. To handle X processing in these devices the DDM will be broken into two parts. One part will just be an executable version of the BDD that represents the equation for the DDM (DDM-kernel). The other part takes the values of the inputs and passes them to the DDM-kernel (DDM-api). If the value of any input is X, the DDM-api calls the DDM-kernel with all values that can be represented by the X input (ie. 1X0=110 & 100). If the DDM-kernel returns the same value for every input combination, that value is scheduled for the next event. If at any time different values are returned, X becomes the value scheduled for the next event.

As an alternative to generating executable DLLs, the BDDs can be converted to a table of data stored in a generic simulator device that gets executed by a single simulation model whenever an event must be scheduled. This allows for the BDD generation portion of the project to be tested before any DLLs can be generated. It also allows for a comparison of the speed increase of compiled models to a generic model.

Pruning

After all worthy networks in the SNF have been replaced by DDMs, the SNF is pruned of unnecessary nodes and devices. The SNF is traced from all the outputs back to the inputs, marking every node and device along the way. Once every output has been traced all unmarked nodes and devices are deleted. By removing the unused portion of the SNF at this time, rather than when the DDM was generated, one avoids the problem of removing a subnet that feeds the networks of two distinct nodes.

Examples of DDMs

Figure 6:
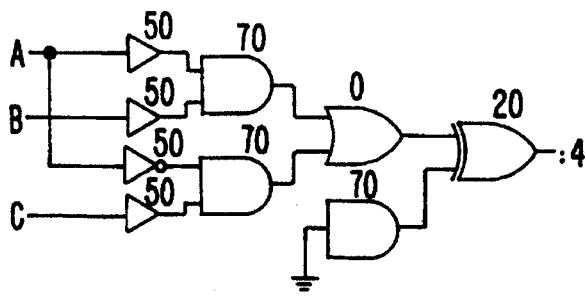
FIG. 6 is a logic diagram of a logic network in which all path delays are equal.
Figure 7:
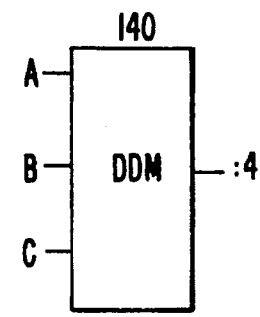
FIG. 7 is a representation of a dynamic device model (DDM) corresponding to the network of FIG. 6.

The best network candidate for replacement by a DDM is a network in which all paths are equal, i.e., one in which every path from the sources of the network to the destination node is the same temporal length. This example also demonstrates why it is important to remove paths that lead to GND or VCC because of the potential path length differences. The example illustrated in FIGS. 6 and 7 is for the equation OUT=AB+!AC. All the time values given are in tenths of nanoseconds. By using a DDM in this case the savings are substantial: 9 devices are replaced by 1 and 12 nodes are replaced by 4.

The following examples give equations and the DDMs that represent them for circuits with varying delay paths.

Single Expander

Figure 8:
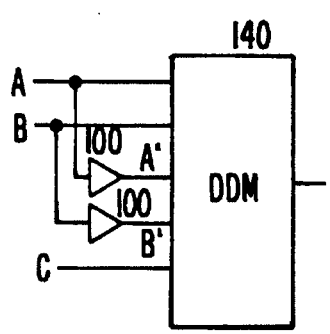
FIG. 8 is a representation of a DDM corresponding to a network with differing delay paths.

A single expander causes a network to have differing delay paths. The equation: OUT=AB+EXP(AB)C, has two different delay paths to the inputs A and B. To accommodate these two-delay paths, two delays are added between the A and B inputs and the DDM as illustrated in FIG. 8. The outputs of the delays, as well as the three inputs, then feed the DDM. Because the two delays have to be added this DDM insertion does not improve the netlist as greatly as the previous example, but the number of devices is reduced from 12 to 3 and the number of nodes is reduced from 15 to 6.

Multiple Expanders

Figure 9:
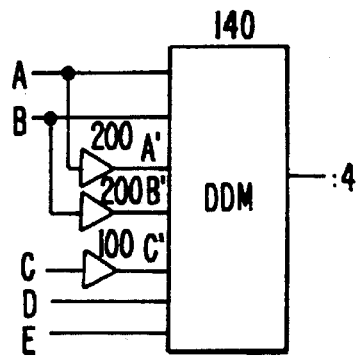
FIG. 9 is a representation of a DDM corresponding to a network using multiple expanders.

This example uses expanders feeding expanders to illustrate a DDM that has several different delay paths that feed it. The equation is OUT=EXP(EXP(AB)C)D+ABE and the DDM is shown in FIG. 9. Because A and B feed a chain of two expanders, each one adds a delay between themselves and the DDM. These delays are 20 nanoseconds in size and the inputs A and B, as well as the outputs of the delays, feed the DDM. The signal C feeds one expander and is not used elsewhere in the equation. A delay of 10 nanoseconds is added between C and the DDM. Only the output of the delay feeds the DDM. In this example, the number of devices is reduced from 17 to 4 and the number of nodes is reduced from 21 to 9.

Parallel Expanders

Figure 10:
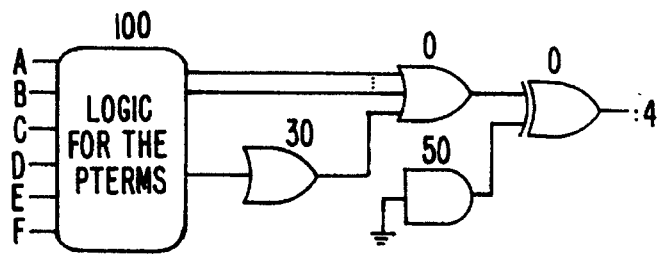
FIG. 10 is a logic diagram of a logic network using parallel expanders.
Figure 11:
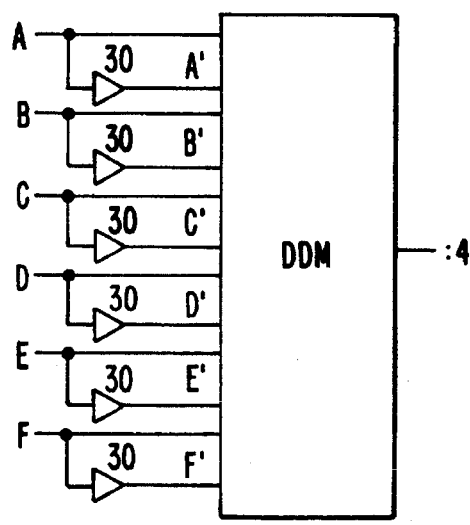
FIG. 11 is a representation of a DDM corresponding to the network of FIG. 10.

Parallel expanders which are represented by a wide input OR device fed by another OR device can be represented by a DDM because the additional delay for the second OR device is pushed out to the input to the DDM. This example uses the equation OUT=!ABCDEF+A!BCDEF+AB!C-DEF+ABC!DEF+ABCD!EF+ ABCDE!F to force the use of parallel expanders. The net is illustrated in FIG. 10 and the corresponding DDM is shown in FIG. 11. This results in a network with two delay paths to every input, but the overall improvement is great because of the number of devices and internal nodes that can be removed. The number of devices is reduced from 45 to 7 and the number of nodes is reduced from 52 to 13.

The details of the algorithms and data structures used to optimize a fully expanded SNF (after SIMNET/FSN and S2EW) by the use of compiled device models will now be described. There are four major steps in the process for optimizing the SNF: selection, encryption, compilation and pruning.

DDM Generation Steps

Selection

The selection algorithm is the most 'intelligent' of the algorithms. It will find networks that can be optimized, calculate the minimum delay path through them and determine if replacement by DDMs is warranted. The selection algorithm is preferably adjustable to user options for the handling of RISE-FALL devices. When allowed by a user, RISE-FALL devices will be replaced by delay devices with delays equal to the maximum of TRISE and TFALL; otherwise such devices will not be incorporated into DDMs. The user must also select the types of names that may be removed from a SNF: all names, default names, symbol names generated from netids or no names. The selection algorithm also recognizes and avoids networks that contain cycles and properly handles timing SNFs with quick register feedback (QRF).

To find and reduce all possible networks, every node in the SNF will be checked. If a node is a 'keeper' (a node that cannot be removed because it doesn't feed any devices, it feeds a device that cannot be traced through or has a name that cannot be removed) and has a device feeding it the network for that node is traced to see if it can be reduced to a DDM. Since a network can only be traced to 'keeper' nodes, it is certain that the network will only be tested once.

There are two possible types of 'keeper' nodes at this point: those with devices that cannot be incorporated into a DDM and those with names that cannot be removed. For the former case all the inputs to the device in question are tested and an attempt is made to generate DDMs for them if appropriate. In the latter case the network that feeds the 'keeper' node is tested directly.

To determine if a network should be replaced, it is recursively traced in a depth-first manner to determine the minimum delay path to the sources of the network. At this time the number of devices visited is calculated to determine if the network is worthy of reduction. In the preferred embodiment, the network is deemed worthy of reduction if the number of devices to be replaced by a DDM is three or more. Tests are also made to detect cycles in the network (from expander latches, etc.). Cycles are detected by marking the destination node before tracing the inputs to the device that feeds it and unmarking it when all the inputs have been traced. The first thing checked, when a node is traced, is its mark status. If it is marked a cycle exists and tracing stops without giving the user any indication that a network was or was not reduced.

The following is the general algorithm to implement the recursive trace function. Once this algorithm has been run the number of devices is checked to determine how worthwhile it would be to replace the network with a DDM. If it is worthwhile the network is converted to a Binary Decision Diagram (BDD) as it is traced again. Although this algorithm will detect cycles and abort if one exists the algorithm for generating BDDs must also check for cycles since the entire network may not be checked at this time.

```
ddm_calculate_min_delay(node)
{
        /* check if the node is currently being traced */
        /* and therefor a cycle has occurred */
        if (MARKED(node)) result = FALSE;
        else
        {
                /* check if we've reached a keeper node and can't */
                trace any farther, check the minimum delay if
                it's a keeper */
                if (KEEPER(node))
                {
                        /* compare delay path to this node with the */
                        /* current minimum. Replace the minimum if delay
                        is less. */
                }
                else
                {
                        /* Add the delay from the device that feeds */
                        /* this node to the current delay, if the delay */
                        /* is less than the minimum delay or the delays are */
                        /* equal and we haven't traced enough devices to make */
                        /* replacement recursively test the sources to the device */
                        MARK(node)
                        for (all sources to the device)
```

```
            {
                result = ddm_calculate_min_delay(source_node);
            }
            UNMARK (node)
        }
    }
    return (result)
}
```

Encryption

At this point the minimum delay through the network has been calculated and the usefulness of replacement has been determined. There still may be cycles so the same checks made in the selection algorithm are made while generating the BDD that represents the entire network. To generate this BDD the network is again traced in a depth-first manner. When a keeper node is reached, the delay path between it and the destination node is compared to the minimum delay. If there is a difference a new node and delay device are created. The delay device is given a delay equal to the difference and is connected to the source node and the new node. The new node is then made to feed into the DDM.

To minimize the number of new nodes that need to be created, a list is kept of all the new nodes generated and their delay from the keeper node that spawned them. The list is maintained by linked lists pointed to from the extra node data associated with nodes in the SNF. Each linked list contains DDMS_NODE structures which keep track of the node's id in the SNF, its delay from the keeper node it was generated from (0 for keeper nodes) and a pointer to the next farthest node from the keeper. The structure also contains fields for storing a node's index value in case it is used multiple times in one DDM.

Whenever a keeper node is traced, its node data is checked to see if it points to a linked list of DDMS_NODE structures. If it does not point to a list, a DDMS_NODE structure is allocated and the node data is made to point to it. Once the node data points to a list the list is scanned for a node with the proper delay from the source node. If a node is not found with the proper delay a new node is created along with a delay device, of the proper delay. A new DDMS_NODE structure is then allocated for the new node and inserted into the list. The list is maintained in order from smallest delay (0 for the source node) to largest delay.

Once a node structure has been found it must get an index value. The ddm_index is compared to the value for the current DDM. If a match exists, this node has already been used in a vertex in the BDD being generated for this DDM and has a valid index. If no match exists, the node was newly created or used in a previous DDM. The ddm_index is given the value for the current DDM and the index is given the value of the ddm_current_index global variable, after which the ddm_current_index variable is then incremented. By saving all the nodes created at a given delay from a keeper node they may be reused in different BDDs and thereby reduce the number of nodes used in the SNF further.

When the node that will serve as an input to the DDM is found it is converted into a simple BDD. A non-terminal vertex is generated for it and the children of the vertex are made to point to the global terminal vertices. Global terminal vertices are used to eliminate a large amount of the allocation and freeing that would have occurred if they were treated as normal vertices. This results in little or no increase in complexity of the code for the BDD algorithms and in some cases actually simplifies the code. The vertex just created is given the index value and node id of the node found for it and the first available id (after those used by the terminal vertices). The new BDD is returned to the recursive function that traced to the keeper node. That function then combines the BDD with the BDDs generated by tracing any other sources to the current device being traced. The BDDs are combined using the function of the device being traced. The BDD generated by combining all the smaller BDDs is then returned to the function that called it. The algorithms for combining and reducing BDDs are given below.

```
ddm_apply_bdd(v1, v2, op)
    /* Check the global table for these vertices being applied */
    /* already. This table will give allocation problems */
    if ((vertex = ddm_vertex_table[v1][v2]) == NULL)
    {
        /* evaluate the two vertices with the operation passed */
        value = ddm_evaluate_operation(v1, v2, op);
        /* If the value is for a terminal vertex return a */
        /* pointer to the appropriate value and mark the table */
        /* Otherwise create a new vertex. */
        if (TERMINAL(value))
        {
            /* return the pointer to the proper terminal vertex */
        }
            /* allocate a vertex record and add it to the table */
            /* give the index and node id of the vertex with */
            /* the smaller index */
            vertex—>index = min(v1—>index, v2—>index);
            /* If the vertex created has the same index as one of */
            /* the vertices passed use the low and high children of */
            /* that vertex to generate the low and high children */
            /* of the new vertex, otherwise use that vertex to */
```

```
            /* generate the children for the new vertex. */
            if (vertex—>index == v1—>index);
            {
                v1_low = v1—>low; v1_high = v1—>high;
            }
            else
            {
                v1_low = v1; v1_high = v1;
            }
            if (vertex—>index == v2—>index)
            {
                v2_low = v2_low; v2_high = v2->high;
            }
            else
            {
                v2_low = v2; v2_high = v2;
            }
            /* now generate the children for the new vertex */
            /* with recursive calls to ddm apply_bdd */
            vertex->low = ddm_apply_bdd(v1_low, v2_low, op);
            vertex->high = ddm_apply_bdd(v1_high, v2_high, op);
        }
    }
    return (vertex)
}
```

The ddm_vertex_table is a two dimensional table of pointers to DDMS_VERTEX structures and is used to speed up the evaluation of two BDDs. The maximum theoretical size of this table is 128×128 because of a 64 K memory limit. The practical maximum with allocation overhead is @100×100. Since this would not appear to be an acceptable limit, the size of the ddm_vertex_table is expanded to a 10×10 array that points to 100×100 arrays of pointers to vertices. This gives an effective size of 1000× 1000, which is adequate. To optimize the allocation of this table the 100×100 pages are only allocated when needed to handle two appropriate vertices. The pages are not freed until the DDM module is exited and are cleared whenever two new BDDs are combined since they are just place holders and are not responsible for freeing any of the vertices they point to.

After a BDD is generated with ddm_apply_bdd( ) it must be reduced with the algorithm described below for ddm_reduce_bdd ( ).

```
ddm_reduce_bdd(vertex)
{
        /* allocate space for vertex_table, vlist_table & sort_table */
        /* this can be the most complex part of the algorithm because */
        /* the size of these tables is not known in absolutes. The */
        /* vertex_table must be big enough to contain all the unique */
        /* vertices when this vertex has been reduced, the vlist_table */
        /* must be the size of the ddm_current_index value and the */
        /* sort_table must be large enough to hold all the vertices */
        /* from the widest level of the BDD. Since two of these sizes */
        /* are not known at the start the vertex _table and sort_table */
        /* will be allocated to a constant size and reallocated when */
        /* needed. */
        /* Once the tables have been allocated the BDD is traversed */
        /* and a list of vertices is generated for every index value */
        /* and added to the vlist_table */
        /* the vlist_table is then traced from the largest index */
        /* to the smallest, essentially tracing the BDD one level at */
        /* a time from bottom to top, skipping over the terminal */
        /* vertices */
        for (index = ddm_current_index -1; index >= 0; index--)
        {
                /* Check every vertex at this level of the BDD */
                {
                        /* a vertex that points to the same vertex with all */
                        /* of its children is considered redundant and is */
                        /* removed by giving it the id of one of its children */
                        if (REDUNDANT(vertex))
                        {
                                /* This now points directly to its child */
```

```
            vertex—>id = vertex—>low—>id;
        }
        else
        {
            /* This vertex is used to generate a key which is */
            /* added to the sort table. The sort table is */
            /* cleared for each level of the BDD. It is used to */
            /* sort the vertices at one level to ease in */
            /* identifying the unique vertices */
            /* The key just contains the id values of the child */
            /* vertices, ie (0, 1) (2, 1) (low_id, high_id) */
        }
    }
    /* sort the sort-table by key */
    /* check the sort _table for unique vertices. If the key */
    /* does not match the last key the key represents a unique*/
    /* vertex which is then added to the vertex table. At each*/
    /* level the original key to compare is cleared so keys */
    /* are only compared for vertices at the same level of */
    /* the BDD */
    /* Once all keys have been checked clear the keys in the */
    /* sort table and test the next level */
    reduced_root = vertex_table[vertex—>id];
    /* Free all the tables generated and any vertices pruned */
    /* from the BDD use the traverse and mark technology to tag */
    /* the vertices still used and remove the others. Could do */
    /* the marking in the code that adds unique vertices to the */
    /* vertex_table. */
    return (reduced_root);
}
```

Compilation

To generate the compiled model the BDD that represents the entire network is translated into a series of test and jump calls that are then added to a DLL to be loaded with the SNF and called whenever the model needs to be evaluated. For example the BDD for the equation A & B can be compiled into the following command sequence:

| x3: | TEST A          | % test the value of A, if 0 go to the terminal vertex x0 % |
|-----|-----------------|-----------------------------------------------------------|
|     | JUMP IF ZERO x0 |                                                           |
| x2: | TEST B          | % test the value of B, if 0 go to the terminal vertex x0 % |
|     | JUMP IF ZERO x0 |                                                           |
| x1: | RETURN 1        | % terminal vertex %                                       |
| x0: | RETURN 0        | % terminal vertex %                                       |

The code is set up to test the inputs for a zero and jump to a label defined by the id of the vertex that was the low child of a node, and fall through to code generated from the high child. This continues until a terminal vertex is reached and a value is set up to be returned from the model.

Pruning

After all worthy networks in the SNF have been replaced by DDMs the SNF is pruned of unnecessary nodes and devices. The SNF is traced from all the outputs back to the inputs, marking every node and device along the way. The marking is done with additional data added to every node and device in the SNF. Once every output has been traced all unmarked nodes and devices are deleted. Special case code is included to avoid deleting dangling nodes to handle active low push-back and multiply named nodes. By removing the unused portion of the SNF at this time, rather than when the DDM was generated, one avoids the problem of removing a subnet that feeds the networks of two distinct nodes.

Data Structures

The main data structures used in the implementation of the above-described algorithms, and the reasoning underlying these structures, will now be described.

```
DDMS_NODE
typedef struct DDMS_NODE
{
    SNAT_ID          node_id;      /* node_id in the SNF */
    long             delay         /* delay from the original node */
    struct DDMS_NODE *next_node;   /* next node from the source */
    int              index;        /* index used for ordering the BDD */
    int              ddm_index;    /* since indexes are only kept */
                                   /* inside an individual DDM this */
                                   /* tells if the above index was */
                                   /* generated for the current DDM */
} DDMS_NODE;
```

The node data structure is used to store the keeper nodes and new nodes generated from them that feed into the DDMs. By saving these nodes we can not only reuse nodes in a single DDM but also in different DDMs in one SNF. These structures are allocated for every node that feeds a DDM and only freed once the entire SNF has been processed.

```
DDMS_VERTEX
typedef struct DDMS_VERTEX
{
    SNAT_ID            node id;
    int                index;
    SCAT_LOGIC_LEVEL   value;
    int                id;
    BOOL               mark;
    struct DDMS_VERTEX *low;
    struct DDMS_VERTEX *high;
} DDMS_VERTEX;
/* This list is used in the reduction algorithm */
typedef struct DDMS_VLIST
{
    DDMS VERTEX        *vertex;
    struct DDMS_VLIST  *next;
DDMS_VLIST;
```

The vertex structure is used to store the information about one vertex in a BDD. The node_id is the node in the SNF that feeds the DDM. The index is the value used to order the vertices in a BDD, which are ordered from 0 to n with 0 noting the root of the graph. The index is retrieved from the DDMS_NODE structure when a vertex is first generated. Terminal vertices always share the index value −1. The value field is an SCAT_LOGIC_LEVEL value, SCA_NO_LEVEL for non-terminal vertices and SCA_LOGIC_HIGH or SCA_LOGIC_LOW for terminal vertices. The id field is used by the reduction algorithm to identify unique vertices and the mark field is used to tag vertices when traversing a BDD. The low and high pointers refer to the children when the node associated with this vertex is evaluated with a low or high logic level.

The list structure is used in the reduction algorithm to generate a table of linked lists of vertices with the same index level.

```
DDMS_KEY
typedef struct DDMS_KEY
{
    DDMS_VERTEX   *vertex;
    int           low_id;
    int           high_id;
}DDMS_KEY;
```

This is the structure used in the reduction algorithm for sorting vertices at the same level to determine whether or not they are unique. The vertex pointer points to the vertex that this key was generated for. The low_id and high_id fields are used to compare one key to another. These fields are generated from the ids of the lower and higher children of the vertex for this key.

```
DDMS_NODE_DATA
typedef struct DDMS_NODE_DATA
{
    DDMS_NODE   *node;
    BOOL        mark;
}DDMS_NODE_DATA;
```

This structure is used to store a pointer to a linked list of nodes used in DDMs. This provides a place to store index values and allows nodes to be reused by multiple DDMs and thereby save space. It also contains a mark field for use when pruning the netlist or detecting cycles in the SNF.

```
DDMS_DEVICE_DATA
typedef struct DDMS_DEVICE_DATA
{
    BOOL   mark;
} DDMS_DEVICE_DATA;
```

This structure is used to mark the devices used when pruning the SNF. It is defined as a structure instead of a #define to allow for its future expansion if necessary.

The invention has been found to substantially increase the speed with which computer logic simulation can be accomplished, the speed improvement being related to the complexity of the logic design under simulation. In some designs, the simulation speed has been increased by a factor of two, and even greater time savings are envisioned using the invention. In addition, the amount of storage required for the simulator logic netlist can be substantially reduced, depending upon the number of devices replaced by dynamic device models. The invention can be implemented with a variety of computers, such as an appropriately programmed IBM-compatible personal computer operating under the MS-DOS operating system using Windows 3.x as a shell, an Apple Macintosh® computer available from Apple Computer of Cupertino, Calif., a Sun SparcStation or the like.

Figure 12:
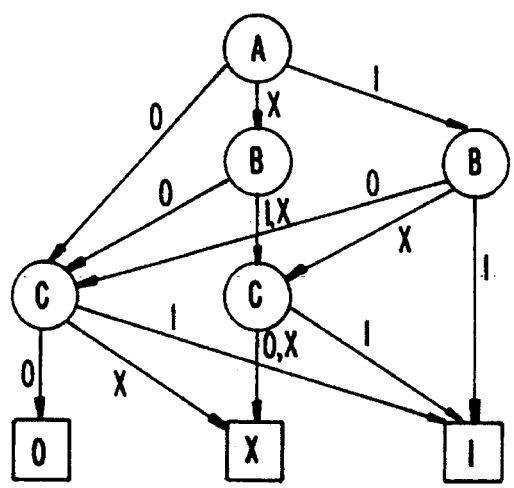
FIG. 12 is an illustrative trinary decision diagram.

While the above provides a full and complete disclosure of the preferred embodiment of the invention, various modifications, alternate constructions and equivalents may be applied, as desired. For example, although the encryption and compilation techniques have been described with reference to binary decision diagrams, trinary (three state) decision diagrams may be employed, especially if tests determine that the processing of unknown logic levels represents a significant portion of the time used for simulation. An example of a trinary decision diagram is shown in FIG. 12. Therefore, the above should not be construed as limiting the invention, which is defined by the appended claims.

What is claimed is:

1. A method for improving the performance of computer logic simulation in a computer system in which the operation of a logic design is simulated by compiling a network list representative of the logic design to obtain a simulator network list and applying predetermined input vectors to the simulator network list representative of the logic design in order to generate output vectors representative of the response of the simulator network list, said method comprising the steps of:

(A) identifying one or more portions of the network list;

(B) preventing the identified portions from the network list from being compiled to produce a modified network list;

(C) creating one or more dynamic device models in the form of executable code to perform the simulation of one or more of the identified portions, wherein one or more of the dynamic device models can be used to more quickly simulate the compiled portion of the network it replaces, wherein said network list includes a plurality of individual networks at least some of which are coupled to operationally non-replaceable keeper nodes, further performing the substeps of:

(I) identifying all keeper nodes by (a) identifying those networks to be replaced by a dynamic device model, including (i) tracing through a given network between all sources to that network and the associated keeper node; (ii) determining the total number of logic elements encountered in step (i); and (iii) selecting the network for replacement with a dynamic device model if the total number exceeds a preselected value; and (b) forming a dynamic device model corresponding to each such network identified in step (a), and (II) selectively replacing individual networks coupled to at least some of said keeper nodes with dynamic device models;

(D) compiling the compilable portions of the modified network list to produce a simulator network list; and (E) using the dynamic device models and the simulator network list to perform the simulation process, thereby improving the performance of the simulation.

2. The method of claim 1, wherein said step (i) of tracing further includes the steps of determining whether the given network embodies a cyclic function, and terminating the tracing when a cyclic function is determined.

3. The method of claim 1, wherein said step (i) of tracing further includes the steps of determining the minimum delay path through the given network between all sources and the associated keeper node, and inserting compensating delay elements for all paths having a transit time exceeding the minimum delay.

4. A method of reducing the size of a simulator netlist used to simulate the operation of a logic design represented by an initial network list having one or more individual networks from which the simulator netlist is compiled the initial network list including operationally non-replaceable keeper nodes, said method comprising the steps of:

(I) identifying all keeper nodes by (a) tracing through a given network between all sources to that network and the associated keeper node; (b) determining the total number of logic elements encountered in step (a); (c) selecting the network for replacement with a dynamic device model if the total number exceeds a pre-selected value;

(II) selectively preventing from compilation individual networks coupled to at least some of said keeper nodes to create a modified network list;

(III) creating dynamic device models in the form of executable code to perform the simulation of the removed individual networks; and (IV) assembling the executable code from step (III) in a dynamic model file.

5. The method of claim 4, wherein said step (a) of tracing further includes the steps of determining whether the given network embodies a cyclic function, and terminating the tracing when a cyclic function is determined.

6. The method of claim 4, wherein said step (a) of tracing further includes the steps of determining the minimum delay path through the given network between all sources and the associated keeper node, and inserting compensating delay elements for all paths having a transit time exceeding the minimum delay.

\* \* \* \* \*